Figure 1:
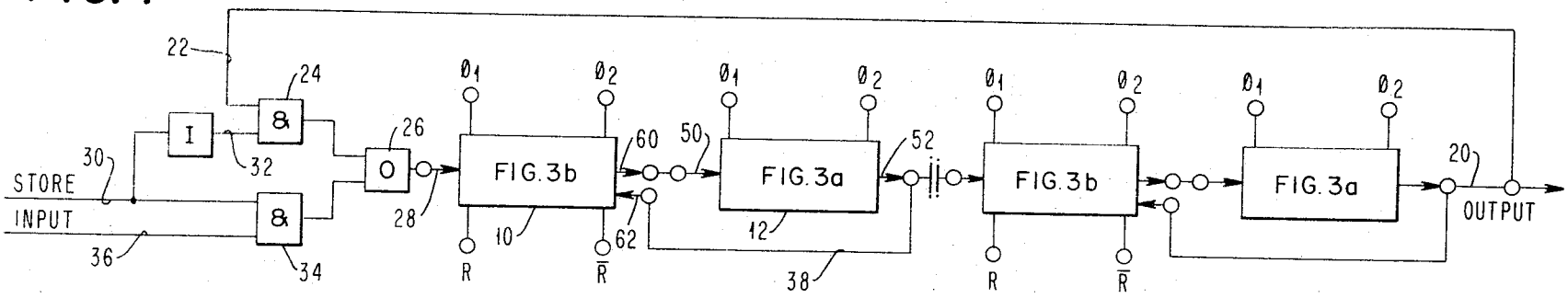
Figure 2:
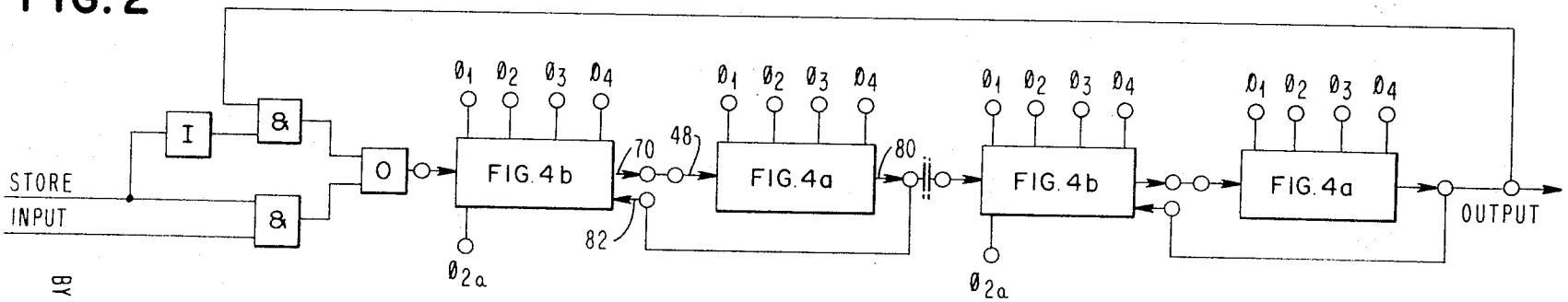
Figure 3A:
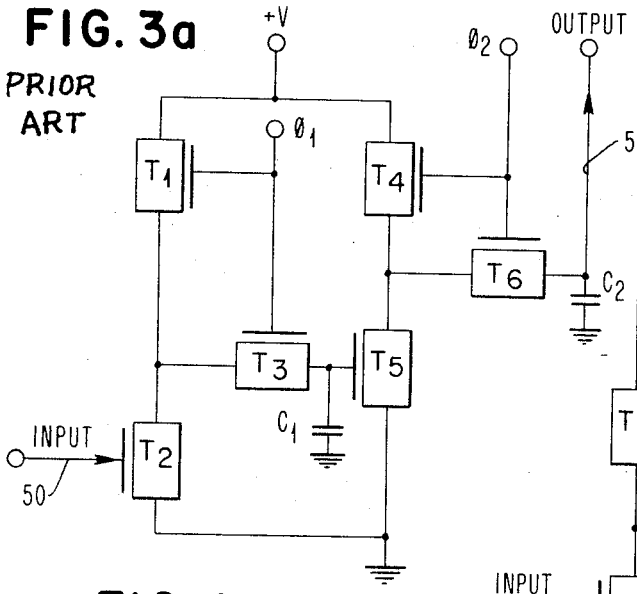
FIG. 3a PRIOR ART
Figure 3B:
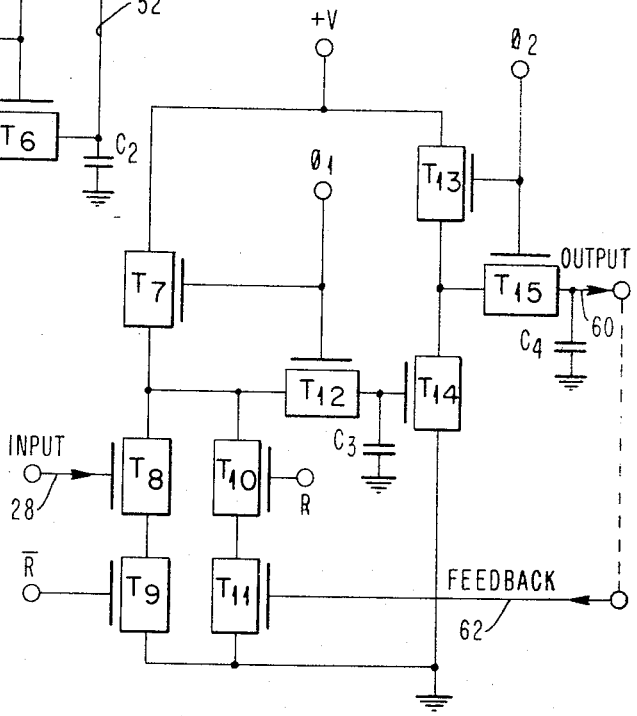
Figure 4A:
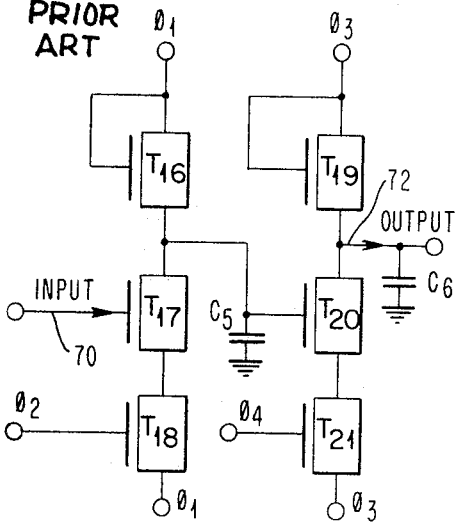
FIG. 4a PRIOR ART
Figure 4B:
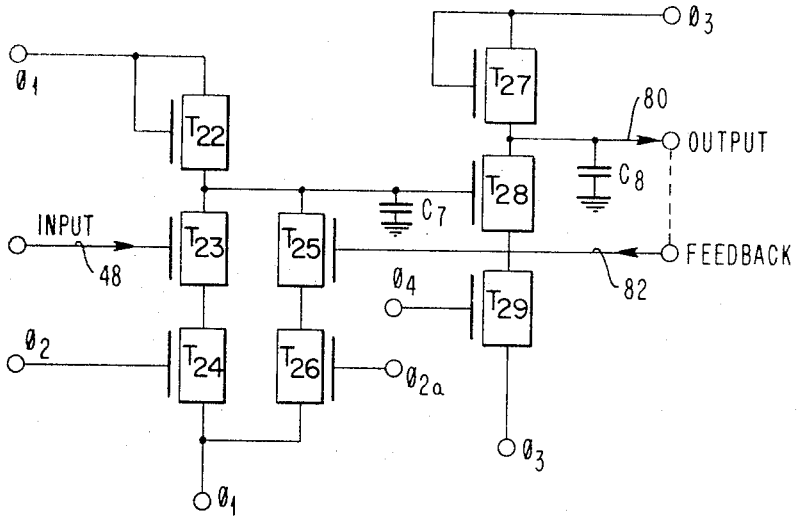
Figure 5:
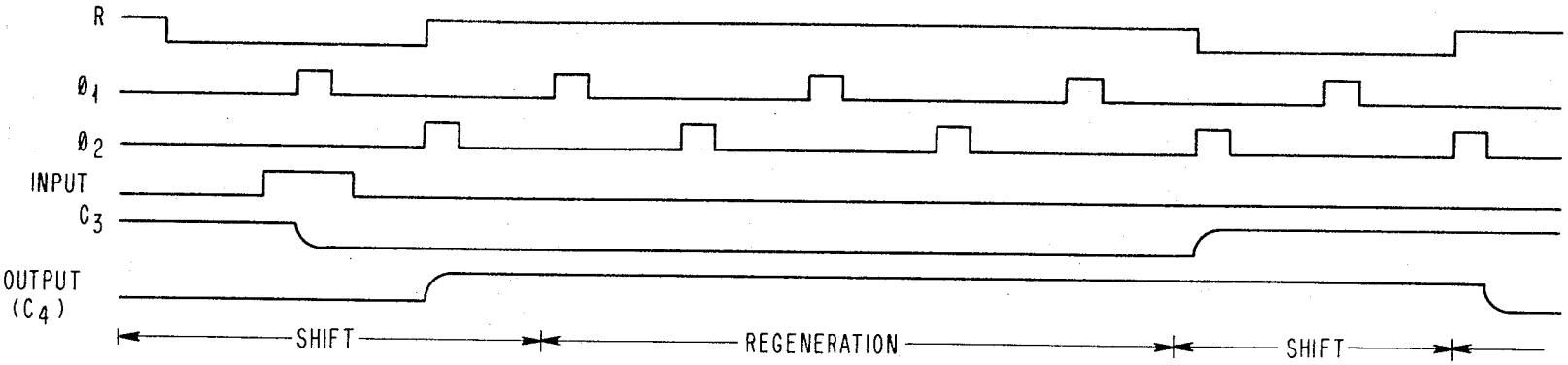
Figure 6:
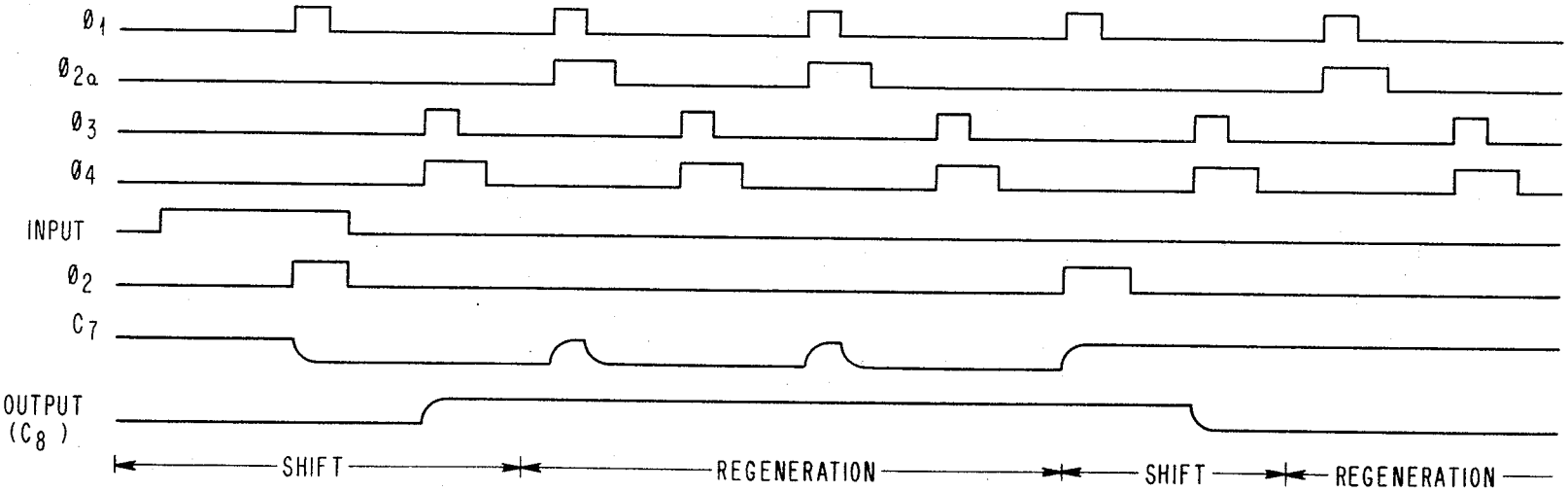

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED AUGUST 14, 1973

913 O.G. 393

T913,008

DYNAMIC SHIFT REGISTER WITH STATIC REGENERATION

William F. Beausoleil, Poughkeepsie, N.Y. assignor to International Business Machines Corporation, Armonk, N.Y.

Continuation of application Ser. No. 50,618, June 29, 1970. This application Feb. 26, 1973, Ser. No. 335,841

Int. Cl. G11c *11/40*

U.S. Cl. 307—221 C

3 Sheets Drawing. 16 Pages Specification

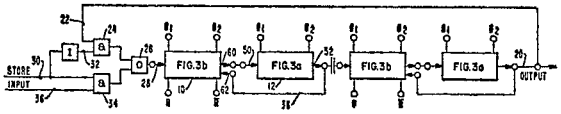

Data stored in dynamic shift registers must be periodically regenerated to preserve the data. This shift register utilizes a feed-back loop which allows data bits to be recycled within individual bit stages or groups of bit stages. This allows the register to have the effect of being static without the cost of static shift register cells.

When operating in the static mode, data are regenerated by shifting the output of a single bit position or a group of bit positions back to the input of the same bit position or the beginning of the group. This, in effect, reduces the regeneration loop from a full shift register length to some subset of a full shift register length.

The shift register is comprised of a plurality of stages, the number of which is chosen to equal the desired capacity of the memory. The output of the last stage of the shift register is fed back to a gating circuit at the input to the first stage in a conventional manner.

Static regeneration is provided, for example, over every two bit positions. That is, data are shifted for two positions and then returned to its initial position. This is accomplished by feed-back loops which feed back the output of one stage to a feed-back input of a prior stage. The remaining stages of the shift register are wired in a similar manner. Now when a regeneration input R is made positive, the information stored in the shift register stages is held static.

DYNAMIC SHIFT REGISTER WITH STATIC REGENERATION

Original Filed June 29, 1970 3 Sheets-Sheet 1

INVENTOR
WILLIAM F BEAUSOLEIL

BY Owen Lamb
ATTORNEY

DYNAMIC SHIFT REGISTER WITH STATIC REGENERATION

Original Filed June 29, 1970 3 Sheets-Sheet 2

DYNAMIC SHIFT REGISTER WITH STATIC REGENERATION

Original Filed June 29, 1970 3 Sheets-Sheet 3